US 9,973,196 B2

(12) United States Patent
Verlinden et al.

(10) Patent No.: US 9,973,196 B2
(45) Date of Patent: May 15, 2018

(54) CLOCK SYNCHRONIZER

(71) Applicant: NXP B.V., Eindhoven (NL)

(72) Inventors: Jos Verlinden, Eindhoven (NL);
Remco van de Beek, Eindhoven (NL);
Stefan Mendel, Gratkorn (AT)

(73) Assignee: NXP B.V., Eindhoven (NL)

( * ) Notice: Subject to any disclaimer, the term of this patent is extended or adjusted under 35 U.S.C. 154(b) by 0 days. days.

(21) Appl. No.: 15/085,821

(22) Filed: Mar. 30, 2016

(65) Prior Publication Data

US 2016/0294398 A1    Oct. 6, 2016

(30) Foreign Application Priority Data

Mar. 30, 2015  (EP) .................................... 15161761

(51) Int. Cl.

| H03L 7/087 | (2006.01) |
|---|---|
| H03L 7/197 | (2006.01) |
| H03L 7/23 | (2006.01) |
| H03L 7/107 | (2006.01) |
| H03L 7/18 | (2006.01) |
| H04B 5/00 | (2006.01) |
| H04L 7/033 | (2006.01) |
| H04W 4/00 | (2018.01) |

(52) U.S. Cl.
CPC ............ *H03L 7/087* (2013.01); *H03L 7/1075* (2013.01); *H03L 7/1803* (2013.01); *H03L 7/197* (2013.01); *H03L 7/1974* (2013.01); *H03L 7/235* (2013.01); *H04B 5/0031* (2013.01); *H04L 7/0331* (2013.01); *H04W 4/008* (2013.01)

(58) Field of Classification Search
CPC ..... H03L 7/087; H03L 7/1075; H03L 7/1803; H03L 7/1974; H03L 7/0331; H03L 7/235; H03L 7/197; H04B 5/0031; H04W 4/008
USPC ........................................................ 327/158
See application file for complete search history.

(56) References Cited

U.S. PATENT DOCUMENTS

| 7,567,644 B2 | 7/2009 | Wagner |
| 7,583,774 B2 * | 9/2009 | Lesso ...................... H03L 7/087 |
| | | 375/376 |
| 8,384,452 B1 | 2/2013 | Parker et al. |

(Continued)

FOREIGN PATENT DOCUMENTS

WO    2004100380 A1    11/2004

OTHER PUBLICATIONS

European Search Report, 15161761, dated Oct. 20, 2015.

*Primary Examiner* — Patrick Chen (57) ABSTRACT

Apparatus for clock synchronization comprising a first phase locked loop (405) and a second phase locked loop (400). The first phase locked loop (405) is configured to receive a reference signal (Fcrystal) having a reference frequency, and operable to produce an output signal (Fout) having an output frequency that is a multiple of the reference frequency. The first phase locked loop (405) comprises a frequency divider (428) that controls the multiple in response to a control signal. The second phase locked loop (400) is configured to determine a phase error between the output signal (Fout) and an input signal (Fantenna), and to provide the control signal to the first phase locked loop (405). The second phase locked loop (400) comprises phase adjustment means (450), operable to adjust a phase difference between the input and output signal by varying the control signal for a duration.

10 Claims, 6 Drawing Sheets

(56) References Cited

U.S. PATENT DOCUMENTS

| | | |
|---|---|---|
| 8,384,453 B1 | 2/2013 | Caviglia et al. |
| 8,674,731 B1 | 3/2014 | Hellmer et al. |
| 8,786,337 B2 | 7/2014 | Mohajeri et al. |
| 8,934,836 B2 | 1/2015 | Lefley |
| 2009/0039968 A1 | 2/2009 | Thomsen et al. |
| 2010/0188158 A1* | 7/2010 | Ainspan ............... H03L 7/081 331/1 A |
| 2014/0273830 A1* | 9/2014 | Wong ............... H04B 5/0031 455/41.1 |
| 2015/0063517 A1 | 3/2015 | Verlinden et al. |

* cited by examiner

CLOCK SYNCHRONIZER

CROSS-REFERENCE TO RELATED APPLICATIONS

This application claims the priority under 35 U.S.C. § 119 of European patent application no. 15161761.0, filed on Mar. 30, 2015, the contents of which are incorporated by reference herein.

FIELD

The disclosure relates to a clock synchronizer, which may be used in a near field communications device.

BACKGROUND

A card (PICC—proximity integrated circuit) mode near field communications (NFC) device with a small loop antenna needs to do active load modulation in order to reach ISO required load modulation amplitude. This means that instead of using a load-modulation switch that alters an impedance loading of the antenna, it is necessary to actively transmit a signal back to the proximity coupled device (PCD). This transmitted signal effectively overwrites the NFC antenna signal received from the PCD. The ISO standard for this active load modulation requires the active load modulation signal to remain synchronized to the transmitted carrier. To remain synchronous during the load modulation process (where it is not possible to use the PCD generated carrier as a reference) it is desirable to generate in the PICC-mode NFC device a highly stable clock with the same frequency as the PCD carrier.

US2015/063517 discloses an apparatus comprising a first phase locked loop (PLL) circuit and a second PLL circuit. The first PLL circuit receives a stable reference-oscillation signal, and, in response to a PLL-PLL control signal indicating a frequency offset, adjusts a fractional divider ratio of the first PLL circuit. A second PLL circuit receives a carrier signal that is transmitted over a communications channel from a non-synchronous device, and generates the PLL-PLL control signal. The first PLL circuit and the second PLL circuit are together configured to produce an output frequency signal that is synchronous to the carrier signal.

It is desired to be able to vary the phase between the PCD clock and the active load modulated signal transmitted by the PICC mode device with a high resolution.

SUMMARY

According to a first aspect, there is provided apparatus for clock synchronisation comprising:

a first phase locked loop configured to receive a reference signal having a reference frequency, and operable to produce an output signal having an output frequency that is a multiple of the reference frequency, the first phase locked loop comprising a frequency divider that controls the multiple in response to a control signal;

a second phase locked loop configured to determine a phase error between the output signal and an input signal, and to provide the control signal to the first phase locked loop;

wherein the second phase locked loop comprises phase adjustment means, operable to adjust a phase difference between the input and output signal by varying the control signal for a duration.

The value of the multiple may be any positive real number. The multiple value may therefore be an integer, non-integer, and/or may be less than 1.

This arrangement readily provides for high resolution adjustment of phase, while not consuming large amounts of power or chip area.

The second phase locked loop may comprise a phase detector, loop filter and sigma-delta modulator. The phase detector may be configured to provide a phase error signal that indicates a phase difference between the input and output signals. The loop filter may receive phase error signal and provide an input to the sigma-delta modulator. The sigma-delta modulator may be configured to provide the control signal, so as to provide a multiple that is fractional.

The phase adjustment means may be configured to vary an input value to the sigma-delta modulator by adding an offset between the loop filter and sigma-delta modulator.

The phase adjustment means may be configured to vary a transfer function of the loop filter. For example, the phase adjustment means may add an offset within an integral path of the loop filter and/or may add an offset within a proportional path of the loop filter.

The phase adjustment means may be operable to vary the control signal by adding an offset to the output of the sigma-delta modulator by cycle swallowing/adding.

The first phase locked loop may comprise a frequency controlled oscillator, and the frequency divider may comprise a post-divider configured to receive the output of the frequency controlled oscillator and to output the output signal.

The frequency controlled oscillator may be a digitally controlled oscillator, or a voltage controlled oscillator.

The first phase locked loop may comprise a frequency controlled oscillator and a phase detector configured to determine a phase difference between the output of the frequency controlled oscillator and feedback signal. The frequency divider may comprise a feedback-divider connected between the frequency controlled oscillator and phase detector to provide the feedback signal.

The apparatus may further comprise control logic, wherein the apparatus is configured to receive the input signal from an antenna, and the control logic is configured to modulate a loading of the antenna during a transmit period to transmit information to a further antenna that is inductively coupled to the antenna.

The control logic may be configured to operate the phase adjustment means to adjust the phase difference between the output signal and input signal prior to a transmit period.

The control logic may be configured to, after the transmit period, operate the phase adjustment means to revert the phase adjustment that occurred prior to the transmit period. This minimises the need for the phase locked loop to re-synchronize the phase locked loop to the input signal, minimising time to acquire lock.

The apparatus may further comprise an adjustable delay line, configured to adjust the phase difference between the input signal and output signal.

According to a second aspect, there is provided a remote communication device, comprising the apparatus of any preceding claim, and an antenna configured to provide the input signal.

The remote communication device may comprise a near field communications device.

According to a third aspect, there is provided a mobile phone, tablet, or portable personal computer comprising the remote communication device of the second aspect.

These and other aspects of the disclosure will be apparent from, and elucidated with reference to, the embodiments described hereinafter.

BRIEF DESCRIPTION OF DRAWINGS

Embodiments will be described, by way of example only, with reference to the drawings, in which.

It should be noted that the figures are diagrammatic and not drawn to scale. Relative dimensions and proportions of parts of these figures have been shown exaggerated or reduced in size, for the sake of clarity and convenience in the drawings. The same reference signs are generally used to refer to corresponding or similar features in modified and different embodiments.

DETAILED DESCRIPTION OF EMBODIMENTS

Figure 1:
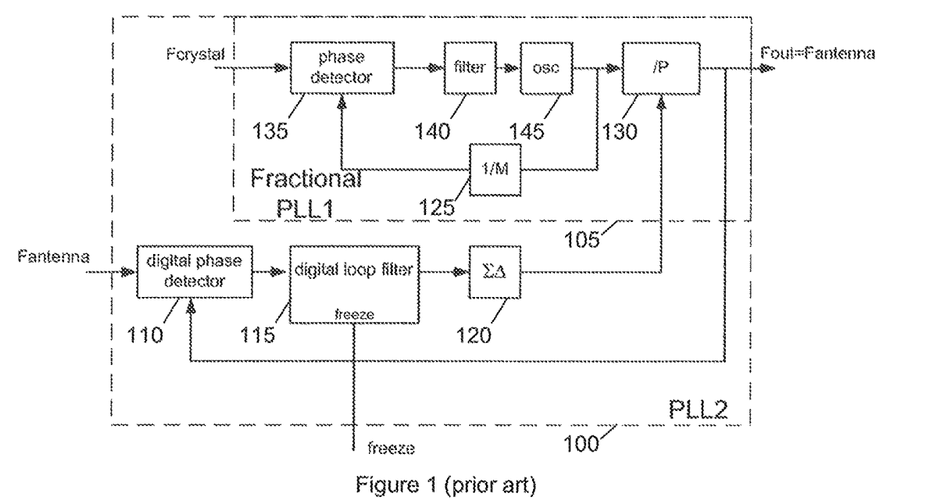
FIG. 1 is an apparatus disclosed in US2015/063517 for synchronizing clocks of remote devices in which the control signal operates to vary a post-divider output signal.
Figure 2:
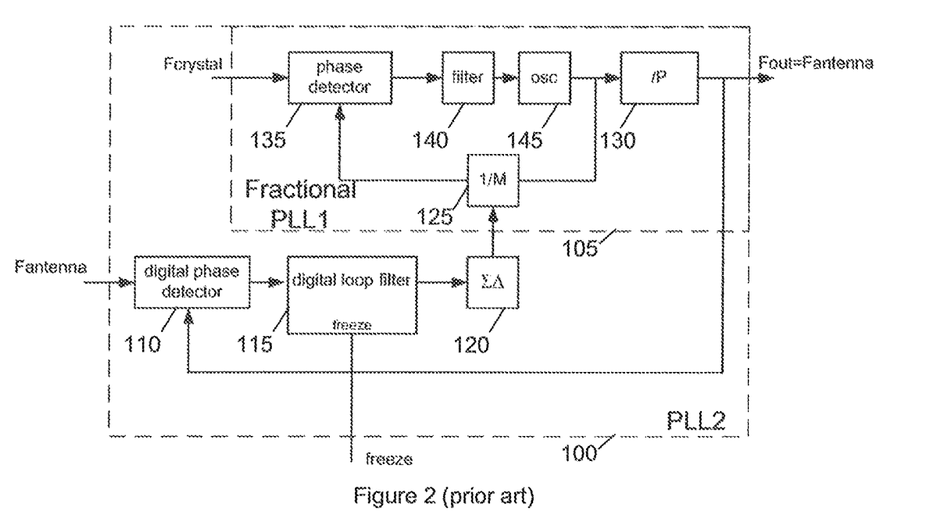
FIG. 2 is an apparatus disclosed in US2015/063517 for synchronizing clocks of remote devices in which the control signal operates to vary a feedback-divider output signal.

Referring to FIGS. 1 and 2, clock synchronizers as disclosed in US2015/063517 are shown. The synchronizer in both FIGS. 1 and 2 comprises a first phase locked loop 105 and a second phase locked loop 100.

The first phase locked loop 105 comprises a phase detector 135, loop filter 140, frequency controlled oscillator 145, post-divider 130 and feedback-divider 125. The phase detector 135 is configured to compare a reference signal Fcrystal with a feedback signal to determine a phase difference between the reference and feedback signal. The loop filter 140 receives the output of the phase detector 135 and performs a filtering operation, for example, low pass filtering. The loop filter 140 is configured to provide an input signal to the frequency controlled oscillator 145. The frequency controlled oscillator 145 produces an output signal having a frequency that is set by the input signal to the frequency controlled oscillator 145. The output of the frequency controlled oscillator 145 is provided to the feedback-divider 125, which divides the frequency of the signal by a factor M. The output of the feedback-divider 125 is provided to the phase detector 135 as the feedback signal. The post-divider 130 divides the frequency of the signal output from the frequency controlled oscillator by a factor P.

In each of FIGS. 1 and 2, the first phase locked loop 105 acts as a frequency stable digitally controlled oscillator for the second phase locked loop 100. The second phase locked loop 100 further comprises a digital phase detector 110, a digital loop filter 115 and a sigma-delta modulator 120.

The digital phase detector 110 is configured to receive a signal Fantenna from an antenna, and to determine a phase difference between the antenna signal and the output Fout from the post-divider 130. The digital loop filter 115 receives the output from the digital phase detector 110, and provides a filtered output signal to a sigma-delta converter 120, which produces a control signal for controlling the frequency of the first phase locked loop 105 by controlling a divider thereof. The sigma-delta converter 120 enables fractional divider ratios for the first phase locked loop, providing flexibility in the frequency at the output of the post-divider 130. In the case of FIG. 1, the sigma-delta converter 120 controls the fractional divider ratio of the post divider 130. In the case of FIG. 2, the sigma-delta converter 120 controls the fractional divider ratio of the feedback-divider 125.

In both cases, the second phase locked loop is operable to adjust the frequency output from the first phase locked loop 105 by varying a fractional divider ratio. In both FIG. 1 and FIG. 2, the output frequency of the first and second phase locked loops can be held at a fixed frequency by freezing the output of the digital loop filter 115.

Figure 3:
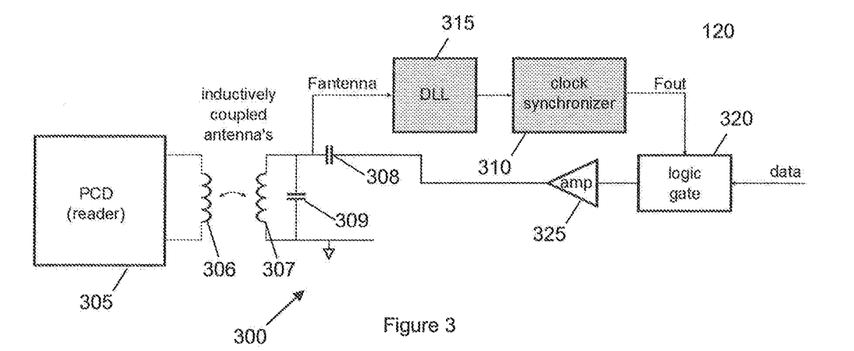
FIG. 3 is a block diagram of a card (PICC) mode near field communications device.

FIG. 3 shows a near field communications system comprising a reader 305 (operating in PCD mode) and a card (or PICC) mode device 300. The reader 305 comprises a first antenna 306. The card mode device 300 comprises a second antenna 307, first capacitor 309, second capacitor 308, delay locked loop 315, clock synchronizer 310, logic block 320, and amplifier 325. The clock synchronizer 310 may comprise a clock synchronizer as shown in FIG. 1 or 2.

The first and second antenna 306, 307 are configured for mutual inductive coupling. The delay locked loop 315 is configured to provide an adjustable phase difference between the signal received from the second antenna Fantenna and the output of the clock synchronizer Fout. The logic block 320 receives the output of the clock synchronizer 310 and is operable to transmit a data using the second antenna 307 via the amplifier 325.

Although this arrangement provides for adjustment (via the delay locked loop 315) of the relative phase between the signal Fantenna received by the antenna 307 of the device 300 and the clock synchronizer output Fout, a delay locked loop 315 has some disadvantages. It is problematic to achieve high resolution with a delay locked loop 315. Each additional delay stage in the delay locked loop (necessary for each incremental increase in resolution) consumes additional silicon area and power. An alternative arrangement is therefore desirable.

FIGS. 4 to 9 show clock synchronizers that provide for adjustment of the phase difference between the input signal Fantenna and the output signal Fout, without the disadvantages associated with the delay locked loop of FIG. 3.

Figure 5:
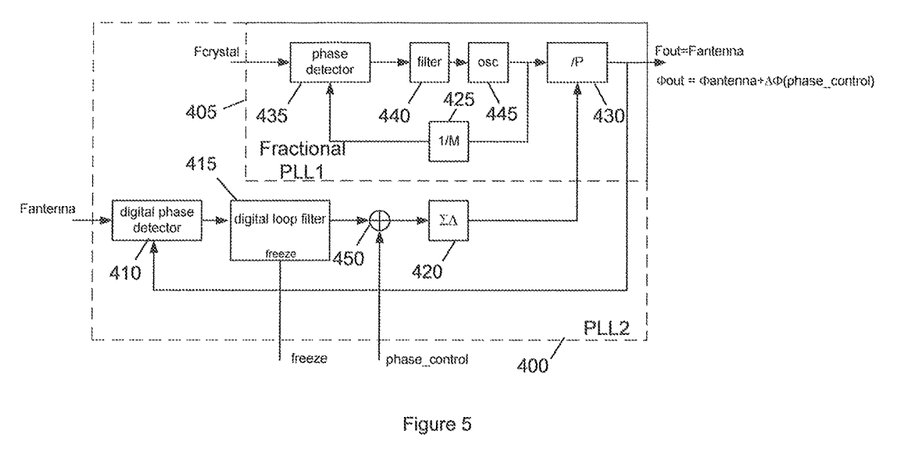
FIG. 5 is a block diagram of a clock synchronizer in which the frequency divider comprises a post-divider controlled by the control signal, and the phase adjustment means is configured to add an offset to an input value of a sigma-delta modulator of the second phase locked loop so as to vary the control signal.
Figure 6:
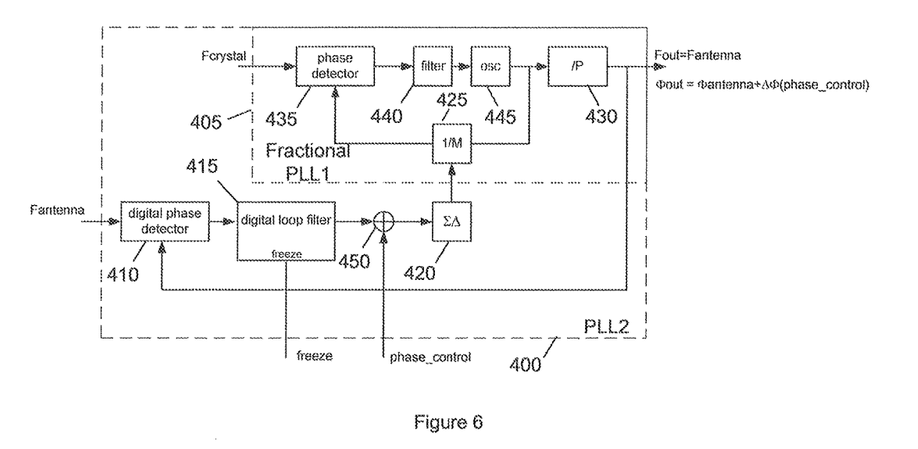
FIG. 6 is a block diagram of a clock synchronizer in which the frequency divider comprises a feedback-divider controlled by the control signal, the phase adjustment means being configured to add an offset to an input value of a sigma-delta modulator of the second phase locked loop so as to vary the control signal.

In each of FIGS. 5 and 6, the first phase locked loop 405 and second phase locked loop 400 are configured in the same way as described with reference to FIGS. 1 and 2 respectively, with the difference that a phase adjustment means 450 is included for varying the phase difference between the output signal Fout and the input signal Fantenna. The phase adjustment means 450 is configured to add an offset to the output from the digital loop filter 415, which will vary the fractional divider ratio of the first phase locked loop 405 via the control signal provided by the sigma-delta modulator 420. In the arrangement of FIG. 5, the fractional divider ratio of the first phase locked loop 405 is adjusted by controlling the post-divider 430. In the arrangement of FIG. 6, the fractional divider ratio of the first phase locked loop 405 is adjusted by controlling the feed-back divider 425.

Varying the control signal in this way results in a mismatch between the frequency of the input signal Fantenna and the output signal Fout. If the control signal is varied in a predetermined way (for example, by a fixed predetermined amount) for a predetermined time (for example a number of cycles of the output frequency), the result will be a predetermined phase shift between the input signal and output signal (or a varying in an existing phase difference by a predetermined amount). This is more clearly illustrated in FIG. 10 (discussed below).

Figure 4:
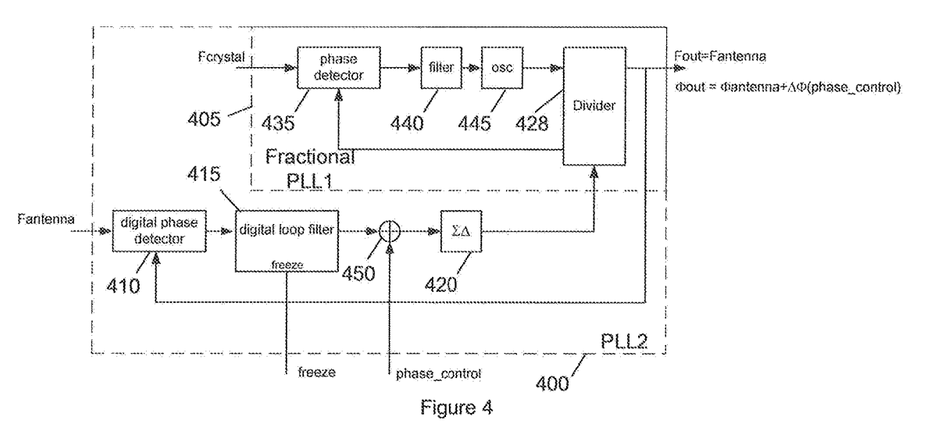
FIG. 4 is a block diagram of a clock synchronizer in which the phase adjustment means is configured to adjust phase by adding an offset to an input value of a sigma-delta modulator of the second phase locked loop so as to vary the control signal.

In FIG. 4, the first phase locked loop 405 includes a generalised frequency divider 428, which may comprise a post-divider and/or a feedback divider. The first phase locked loop 405 in this arrangement comprises phase detector 435, loop filter 440, frequency controlled oscillator 445 and divider 428. The divider 428 may comprise a post-divider and/or a feedback divider. An output from the frequency divider 428 is fed back to the phase detector 435, which is configured to determine a phase difference between the fed-back divider output and a reference input signal Fcrystal. The output of the phase detector 435 is filtered by the loop filter 440. The output of the loop filter 440 controls the frequency of an output signal from the frequency controlled oscillator 445. The divider 428 receives the output from the frequency controlled oscillator 445, and is arranged to divide the frequency thereof to produce both the feedback signal and the output signal Fout.

Figure 7:
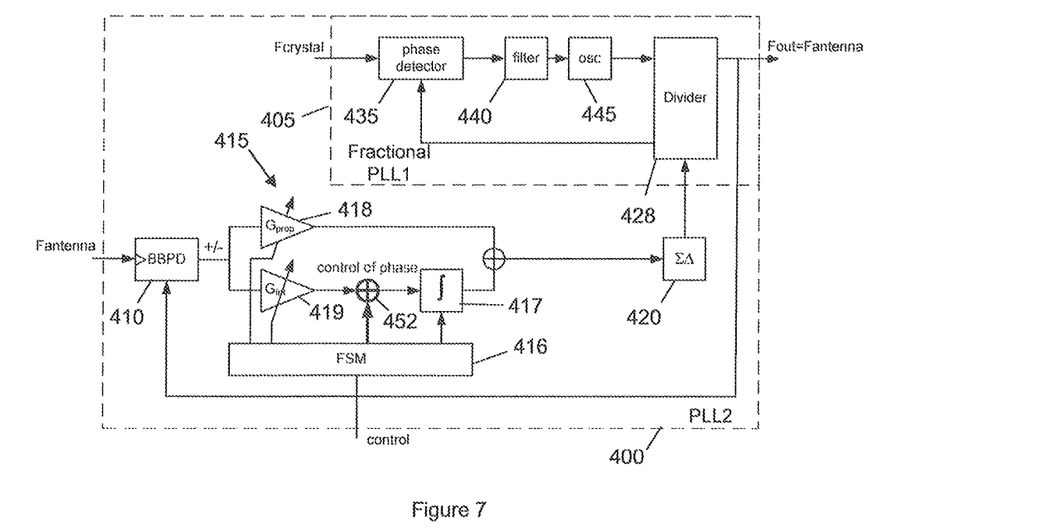
FIG. 7 is a block diagram of a clock synchronizer in which the phase adjustment means is configured to add an offset within a loop filter of the second phase locked loop so as to vary the control signal.

In other arrangements, an alternative phase adjustment means may be used. Referring to FIG. 7, a clock synchronizer is shown comprising a first phase locked loop 405 and a second phase locked loop 400. In this arrangement the phase adjustment means 452 provides an offset within the digital loop filter 415.

The first phase locked loop 405 in this arrangement is the same as that described with reference to FIG. 4. The second phase locked loop 400 comprises a phase detector 410, loop filter 415, sigma-delta modulator 420 and the first phase locked loop 405, which effectively operates as a frequency controlled oscillator for the second phase locked loop 400.

The phase detector 410 is a bang-bang phase detector. The loop filter 415 comprises a proportional path with variable proportional gain stage 418, an integral path with variable integral gain stage 419, an integrator 417 (in the integral path), a finite state machine 416 and a summing block (for combining the proportional and integral paths).

The gain stages 418 and 419 both receive the output of the bang-bang phase detector. Each of the gain stages 418, 419 and the integrator 417 may be controlled by the finite state machine 416, which in turn responds to a control input.

The phase adjustment means 452 in this arrangement provides an offset to the output of the variable integral gain stage 419, which has the effect of varying the output of the loop filter 415 over time. This in turn results in a change in the control signal provided by the sigma-delta modulator 420 to the first phase locked loop 405, resulting in a change in the output frequency of the output signal Fout, compared with the input signal Fantenna. If a constant offset is added within the integral path of the loop filter 415 before the integrator 417, the output of the loop filter 415 will change at a rate proportional to the offset, resulting in a concomitant change in the control signal over time. The phase adjustment resulting from such a phase control offset input will be proportional to the integral of the difference in frequency between the input signal and output signal over time. As the duration of adjustment is increased, the rate of change of phase offset with respect to the duration increases. This may be advantageous, because small adjustments with high resolution and large adjustments can thereby both be accommodated within a limited adjustment duration.

Figure 8:
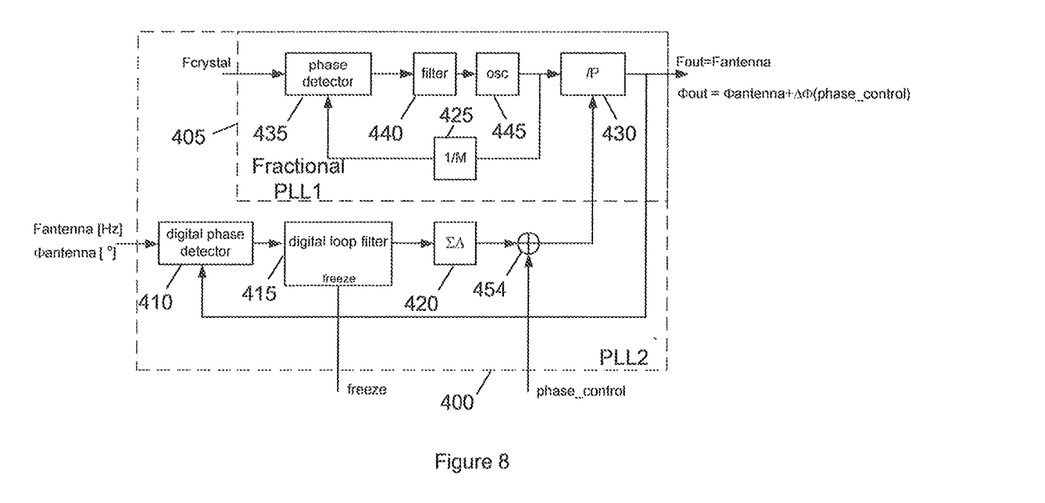
FIG. 8 is a block diagram of a clock synchronizer in which the phase adjustment means is configured to add an offset to the output of a sigma-delta modulator of the second phase locked loop.

Referring to FIG. 8, a further alternative arrangement is shown in which the phase adjustment means 454 is configured to add an offset to the output of the sigma-delta modulator 420, for example by cycle swallowing or adding.

Figure 9:
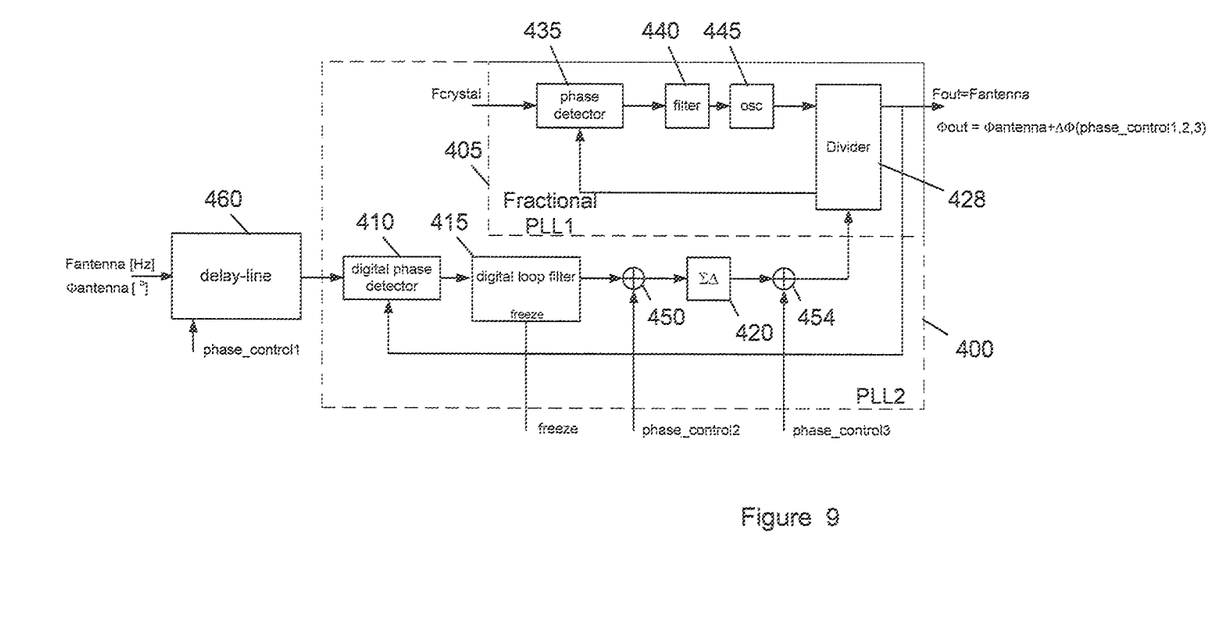
FIG. 9 is a block diagram of a clock synchronizer in which the phase adjustment means comprises a delay line, and is configured to add an offset at both the input and the output of a sigma-delta modulator of the second phase locked loop.

FIG. 9 shows an example that comprises each of the example features for phase adjustment. A first phase locked loop 405 is provided, as shown in FIG. 4. The second phase locked loop 400 includes a digital phase detector 410, digital loop filter 415, sigma-delta modulator 420 and uses the first phase locked loop 405 as a frequency controlled oscillator in which a divider ratio is controlled by a control signal from the sigma-delta modulator 400.

The phase adjustment means comprises a first phase adjustment element 450 and second phase adjustment element 454. The first phase adjustment element 450 is configured to add an offset to the input of the sigma-delta modulator, and the second phase adjustment element 454 is configured to add an offset to the output of the sigma-delta modulator 420. The digital loop filter may comprise a further phase adjustment means in the integral and/or proportional path (not shown). A variable delay line 460 may additionally be provided between the input signal Fantenna and the digital phase detector 410, to provide further phase adjustment means.

Figure 10:
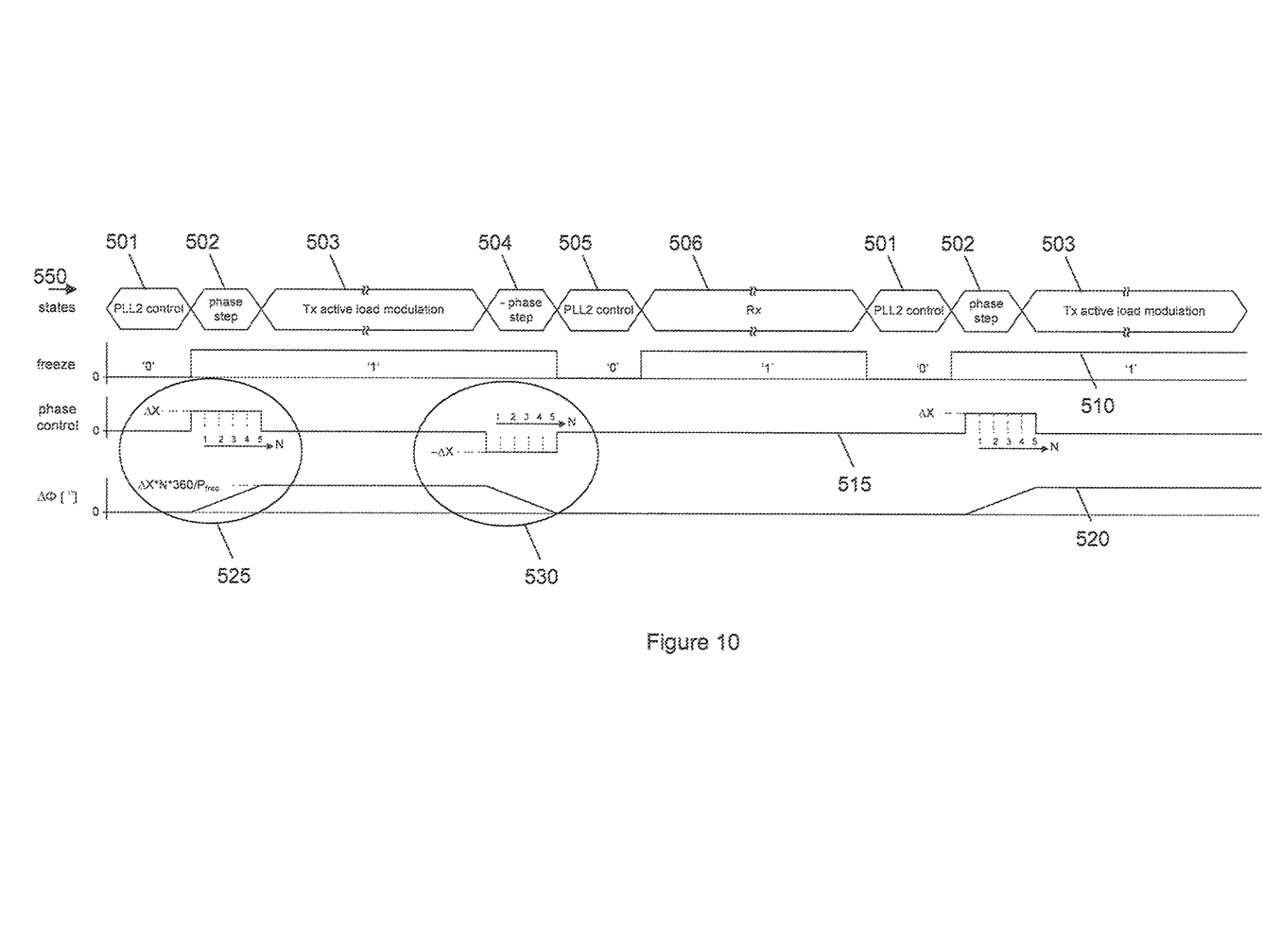
FIG. 10 is a timing diagram illustrating operation of a clock synchronizer varying the phase prior to a transmit period, then reverting the phase variation after the transmit period.

FIG. 10 is a timing diagram illustrating the operation of a clock synchronizer according to FIG. 5. The states 550 with respect to time are indicated, along with values for a freeze signal 510, phase control signal 515 and phase offset 520. The freeze signal 510 is the signal that controls whether the loop filter 415 has its output value fixed (freeze signal=1) or whether the loop filter 415 is responsive to the output of the phase detector 410 (freeze signal=0). The phase control signal 515 is the value of the offset applied to the input of the sigma-delta modulator 420 via the phase adjustment means 450. The phase offset 520 is the change in relative phase between the input and output signal that results from the phase control signal 515.

During a phase locked loop control step 501, the second phase locked loop 400 acquires and/or tracks the frequency of the input signal Fantenna, so as to synchronize the output signal from the second phase locked loop 400 with the input signal. The phase difference between the input and output signal is substantially 0 degrees during this stage.

During a phase offsetting step 502, the freeze signal is applied (freeze signal=1) fixing the output value of the loop filter. A predetermined phase control signal 515 is applied for a predetermined period (or number of cycles). This results in a total phase change over the predetermined period of $\Delta X*N*360/P_{frac}$, where $\Delta X$ is the offset to the divider value, N is the number of cycles over which the phase control offset is applied and Pfrac is the actual (fractional) post-divider ratio P.

For example, selecting values of $\Delta X=0.226$, and $P_{frac}=32.552$ results in a change in phase offset 520 $\Delta \Phi$ of 35 degrees over 14 cycles (i.e. N=14). Selecting values of $\Delta X=3.164$, and $P_{frac}=32.552$ results in a change in phase offset 520 $\Delta \phi$ of 35 degrees over 1 cycle (i.e. N=1). Selecting values of $\Delta X=0.0226$, and $P_{frac}=32.552$ results in a change in phase offset 520 $\Delta \phi$ of 0.25 degrees over 1 cycle (i.e. N=1).

The phase adjustment step 502 is prior to a transmission step 503, during which active load modulation of an antenna may take place so as to communicate data. Following the transmission step 503, there may be a phase offset removal step, in which the phase offset applied in step 502 is removed. Otherwise, when the freeze signal goes low, the second phase locked loop 400 will take longer to acquire phase lock with the input signal. The phase offset removal step 504 may comprise applying the inverse of the phase control signal applied during the phase offsetting step 502. Alternatively, a different value of phase control signal 515 may be applied for a different amount of time, selected to revert the phase offset step 502.

Following the phase offset removal step 504 the freeze signal is set low, and a further phase locked loop tracking step 505 provided, to re-synchronize the phase locked loop with the input signal. This is followed by a receiving step 506, in which data is received from a remote device while the freeze signal is high.

The cycle may then begin again, with the phase locked loop control step 501, etc. A different amount of phase offset may be applied in subsequent cycles, as appropriate.

Although the example timing diagram is described with reference to the example of FIG. 5, it will be appreciated that a similar timing diagram can be drawn illustrating the operation of the other examples. Each of the examples provides the ability to adjust the phase offset between the input and output signals of the second phase locked loop with high resolution, without large penalties in cost and power consumption.

From reading the present disclosure, other variations and modifications will be apparent to the skilled person. Such variations and modifications may involve equivalent and other features which are already known in the art of time to digital converters and phase locked loops, and which may be used instead of, or in addition to, features already described herein.

Although the appended claims are directed to particular combinations of features, it should be understood that the scope of the disclosure also includes any novel feature or any novel combination of features disclosed herein either explicitly or implicitly or any generalisation thereof, whether or not it relates to the same subject matter as presently claimed in any claim and whether or not it mitigates any or all of the same technical problems.

Features which are described in the context of separate embodiments may also be provided in combination in a single embodiment. Conversely, various features which are, for brevity, described in the context of a single embodiment, may also be provided separately or in any suitable sub-combination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality and reference signs in the claims shall not be construed as limiting the scope of the claims.

The invention claimed is:

1. Apparatus for clock synchronisation comprising:
a first phase locked loop configured to receive a reference signal having a reference frequency, and operable to produce an output signal having an output frequency that is a multiple of the reference frequency, the first phase locked loop comprising a frequency divider that controls the multiple in response to a control signal;
a second phase locked loop configured to determine a phase error between the output signal and an input signal, and to provide the control signal to the first phase locked loop;
wherein the second phase locked loop comprises phase adjustment means, operable to adjust a phase difference between the input and output signal by varying the control signal for a duration,
wherein the apparatus further comprises control logic, wherein the apparatus is configured to receive the input signal from an antenna, and the control logic is configured to modulate a loading of the antenna during a transmit period to transmit information to a further antenna that is inductively coupled to the antenna, wherein the control logic is configured to operate the phase adjustment means to adjust the phase difference between the output signal and input signal prior to a transmit period, and wherein the control logic is configured to, after the transmit period, operate the phase adjustment means to revert the phase adjustment that occurred prior to the transmit period.

2. The apparatus of claim 1, wherein the second phase locked loop comprises a phase detector, loop filter and sigma-delta modulator, the phase detector configured to provide a phase error signal that indicates a phase difference between input and output signals, the loop filter configured to receive the phase error signal, and to provide an input to the sigma-delta modulator, the sigma delta modulator configured to provide the control signal.

3. The apparatus claim 2, wherein the phase adjustment means is configured to vary an input value to the sigma-delta modulator by adding an offset between the loop filter and sigma-delta modulator.

4. The apparatus of claim 2, wherein the phase adjustment means is operable to vary the control signal by adding an offset to the output of the sigma-delta modulator.

5. The apparatus of claim 1, wherein the first phase locked loop comprises a frequency controlled oscillator, and the frequency divider comprises a post-divider configured to receive the output of the frequency controlled oscillator and to output the output signal.

6. The apparatus of claim 1, wherein the first phase locked loop comprises a frequency controlled oscillator and a phase detector configured to determine a phase difference between the output of the frequency controlled oscillator and a feedback signal, and the frequency divider comprises a feedback-divider connected between the frequency controlled oscillator and phase detector to provide the feedback signal.

7. The apparatus of claim 1, further comprising an adjustable delay line, configured to adjust the phase difference between the input signal and output signal.

8. A remote communication device, comprising the apparatus of claim 1.

9. The remote communication device of claim 8, wherein the remote communication device comprise a near field communications device.

10. A mobile phone, tablet, or portable personal computer comprising the remote communication device of claim 9.

* * * * *